US007288994B2

(12) United States Patent
Copani et al.

(10) Patent No.: US 7,288,994 B2
(45) Date of Patent: Oct. 30, 2007

(54) DIFFERENTIAL TO SINGLE-ENDED CONVERTER

(75) Inventors: Tino Copani, Riposto (IT); Santo Alessandro Smerzi, Catania (IT); Giovanni Girlando, Catania (IT); Giuseppe Palmisano, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 98 days.

(21) Appl. No.: 11/337,722

(22) Filed: Jan. 23, 2006

(65) Prior Publication Data

US 2006/0186965 A1 Aug. 24, 2006

(30) Foreign Application Priority Data

Jan. 25, 2005 (EP) ................................. 05425027

(51) Int. Cl.
*H03F 3/04* (2006.01)

(52) U.S. Cl. ...................................... 330/301; 330/257

(58) Field of Classification Search ................ 330/301, 330/257, 261, 116

See application file for complete search history.

(56) References Cited

U.S. PATENT DOCUMENTS 4,555,670 A 11/1985 Tanaka ....................... 330/252
4,596,958 A 6/1986 Graeme et al. ............. 330/253
5,323,121 A 6/1994 Butler ........................ 330/252
6,556,084 B2 * 4/2003 Sowlati ...................... 330/296
6,828,856 B2 * 12/2004 Sanchez et al. ............. 330/253
6,980,054 B2 * 12/2005 Okada ........................ 330/257

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A converter is for a differential input signal into a single-ended output signal and may include a differential pair of identical first and second transistors driven by the differential input signal, and a circuit for filtering DC components, connected between the current terminal of the second transistor not in common with the first transistor of the differential pair and an output node of the converter on which the single-ended output signal is generated. The converter generates a single-ended signal without employing a transformer, in lieu thereof the converter may include a current generator biasing the differential pair by of third and fourth output transistors, in a current mirror configuration, connected in series with the first and second transistors, respectively. The converter may also include degeneration resistors of the transistors of the current mirror, dimensioned such that the gains of the converter for each of the two input nodes of the differential signal are equal and of opposite sign.

22 Claims, 4 Drawing Sheets

DIFFERENTIAL TO SINGLE-ENDED CONVERTER

FIELD OF THE INVENTION

This invention relates to electronic converters, and, more particularly, to a differential to single-ended converter.

BACKGROUND OF THE INVENTION

Internal signals of integrated circuits are processed in a differential mode for enhancing rejection of noise coming from the supply lines and from the silicon substrate. It is often necessary to provide these circuits with an output stage that converts the differential signal to a single-ended signal to reduce the number of pins and to simplify the printed circuit board (PCB).

Moreover, especially in RF applications, this output stage should match the load impedance for maximizing the power delivered to the load. FIG. 1 depicts a typical architecture of a differential to single-ended converter for RF applications. The circuit includes a differential pair of transistors input with the differential signal to be converted, and a transformer that provides a single-ended version of the input differential signal to a load $R_L$. The block MN is an impedance matching network for maximizing the power delivered to the load $R_L$.

This approach is burdened by the following drawbacks that limit its use:

- the integrated transformer occupies a relatively large silicon area;
- the level of the single-ended output signal depends on the coupling coefficient k of the primary and secondary windings of the transformer that is relatively small;
- the impedance matching network MN includes resonant circuits and it is not possible to ensure a precisely determined output impedance over a relatively wide range of frequencies;
- the parasitic capacitances of the integrated transformer are not negligible and cause an asymmetry that reduces the common mode rejection ratio of the converter (CMRR).

Another common differential to single-ended converter is depicted in FIG. 2. This architecture substantially comprises a differential pair of transistors, input with the differential signal In+, In− to be converted, and a common emitter transistor Q3 with a degeneration resistor $R_o$. The bias current of the transistor Q3 and the degeneration resistor $R_o$ are determined according to the following equation for matching the load impedance:

$$R_L = R_O + \frac{1}{g_m} \tag{1}$$

wherein $g_m$ is the transconductance of the transistor Q3.

A drawback of this converter is that only the signal on a single collector of the differential pair is used, thus the voltage level of the output single-ended signal is halved. Furthermore, the output signal may be corrupted by noise on the supply lines or generated by the bias current generator. Moreover, since the base-emitter impedance of the common emitter node of the differential pair diminishes with the working frequency, the common mode rejection ratio of the differential pair becomes relatively small at high frequency.

SUMMARY OF THE INVENTION

It has been found an architecture of a differential to single-ended converter, especially suited for RF applications, that has an outstandingly large common mode rejection ratio (CMRR) and matches a load impedance in a broad frequency range. The converter of this invention provides a better trade-off between bandwidth, CMRR and silicon area requirement than the known converters. Moreover, this converter allows the conversion of a differential signal into a single-ended signal with a substantially unitary gain, without a decrement of the voltage level of the signal.

The converter employs a differential pair of identical first and second transistors driven by the differential input signal, and a circuit for filtering DC components, connected between the current terminal of the second transistor not in common with the first transistor of the differential pair and an output node of the converter on which the single-ended output signal is generated.

Differently from the known converters, the converter of this invention does not requires the use of a transformer. In lieu of the transformer the converter includes: a current generator biasing the differential pair by means of two output transistors, third and fourth, in a current mirror configuration, connected in series with the first and second transistors, respectively; and degeneration resistors of the transistors of the current mirror, dimensioned such that the gains of the converter for each of the two input nodes of the differential signal are equal and of opposite sign. Preferably, the differential pair of identical first and second transistors is configured as a source follower.

BRIEF DESCRIPTION OF THE DRAWINGS

The various features and advantages of this invention will become even more evident through the following detailed description of a practical embodiment and by referring to the attached drawings, wherein.

DETAILED DESCRIPTION OF THE PREFERRED EMBODIMENTS

Figure 3:
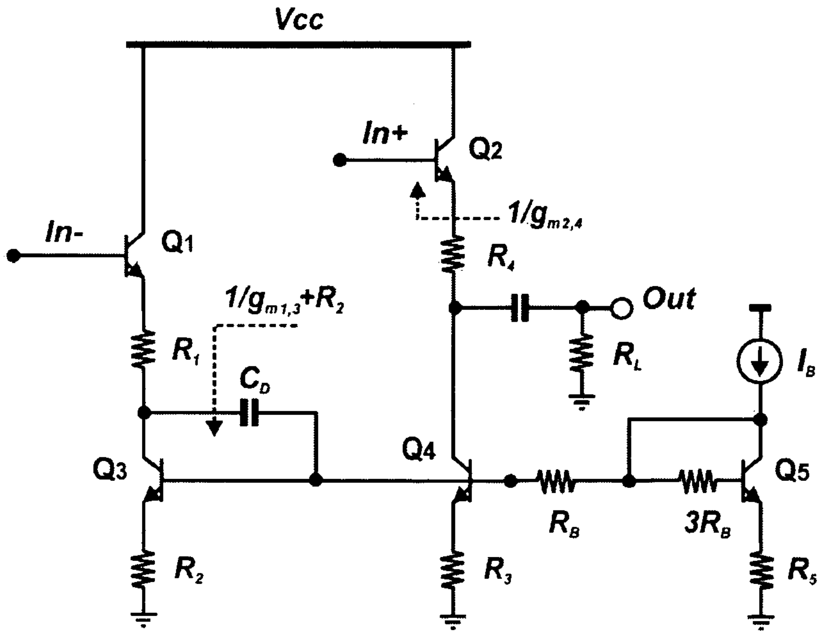
FIG. 3 shows a differential to single-ended converter of this invention.

An embodiment of the converter of this invention is depicted in FIG. 3. By way of example, the converter is realized in BJT technology, but the considerations that will be made apply mutatis mutandis to a similar converter realized in MOS technology and to equivalent circuits in which the conductivity type of the transistors employed is reversed. The converter employs a differential pair of transistors Q1, Q2 in an emitter follower configuration, each biased by a respective current generator Q3, Q4. Preferably, these current generators are implemented by mirroring the two transistors Q3, Q4 to a same transistor Q5 biased with a reference current $I_B$.

Resistors $R_2$, $R_3$ and $R_5$ are dimensioned such that the gain of the converter for each of the two input nodes be the same. Resistor $R_4$ is used for matching the output impedance and its value is determined by the following equation:

$$R_L = R_4 + \frac{1}{g_{m2,4}} \tag{2}$$

The two resistors $R_2$ and $R_3$ must satisfy the following equation:

$$R_2 \cdot g_{m2,4} = R_3 \cdot g_{m1,3} \tag{3}$$

wherein $g_{m2,4}$ and $g_{m1,3}$ are the transconductances of transistors Q2-Q4 and Q1-Q3, respectively. By choosing the resistor RB such that $$R_B \gg \frac{1}{g_{m1,3}} \tag{4}$$

and considering that the capacitor $C_D$ represents substantially a short-circuit for high frequency signals, the impedance "seen" by the emitter of transistor Q3 is $$R_1 + \frac{1}{g_{m1,3}} + R_2 \tag{5}$$

The impedances "seen" by the emitters of the transistors Q3 and Q4 are made equal to each other for reasons of symmetry, hence:

$$R_1 + \frac{1}{g_{m1,3}} + R_2 = R_4 + R_L \tag{6}$$

Figure 4A:
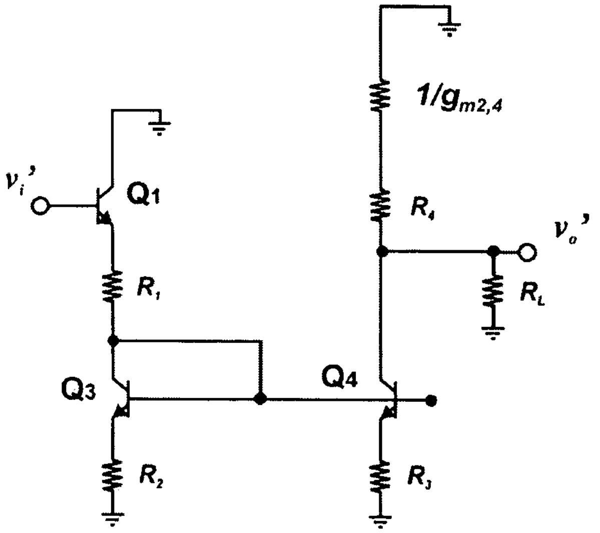
FIGS. 4*a* and 4*b* show small signal equivalent circuits of the converter of FIG. 3.
Figure 4B:
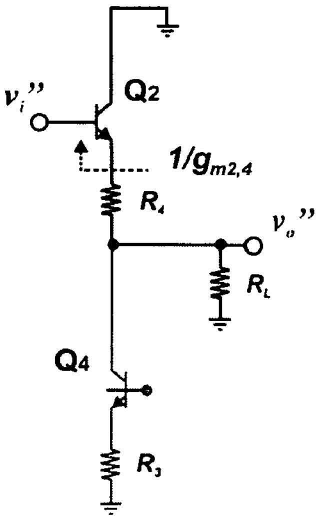

The small signal gain of the converter for each input terminal may be the same to reject the input common mode signals and by referring to the small signal equivalent circuits depicted in FIGS. 4*a* and 4*b*, this means that the ratios $$\frac{v'_o}{v'_i} \text{ and } \frac{v''_o}{v''_i}$$

should be of opposite sign. By analyzing FIG. 4*a*, it is evident that $$v'_o = -\frac{\left(R_4 + \frac{1}{g_{m2,4}}\right) \cdot R_L}{R_4 + \frac{1}{g_{m2,4}} + R_L} \cdot \frac{g_{m2,4}}{1 + R_3 \cdot g_{m2,4}} \cdot \frac{R_2 + \frac{1}{g_{m1,3}}}{R_1 + R_2 + \frac{1}{g_{m1,3}}} \cdot v'_i \tag{7}$$

By substituting eq. (2) into eq. (7)

$$v'_o = -\frac{R_L}{2} \cdot \frac{g_{m2,4}}{1 + R_3 \cdot g_{m2,4}} \cdot \frac{R_2 + \frac{1}{g_{m1,3}}}{R_1 + R_2 + \frac{1}{g_{m1,3}}} \cdot v'_i \tag{8}$$

Finally, by substituting eqs. (3) and (6) into eq. (8)

$$v'_o = -\frac{R_L}{2} \cdot \frac{g_{m2,4}}{g_{m1,3}} \cdot \frac{1}{R_4 + R_L} \cdot v'_i \tag{9}$$

By analyzing FIG. 4*b* and assuming $$R_4 + R_L \gg \frac{1}{g_{m1,3}} \tag{10}$$

the following equation holds:

$$v''_o = \frac{R_L}{R_4 + R_L} \cdot v''_i \tag{11}$$

The common mode rejection ratio for input terminals of the converter of FIG. 3 is maximum when $$\frac{v'_o}{v'_i} = -\frac{v''_o}{v''_i} \tag{12}$$

that is when $$g_{m2,4} = 2 \cdot g_{m1,3} \tag{13}$$

This last condition is satisfied when a current twice the current flowing in the transistors Q1-Q3 is forced in the transistors Q2-Q4, that is when the following condition verifies:

$$R_2 = 2 \cdot R_3 = R_5 \tag{14}$$

By summarizing, given a bias current $I_B$ and a load $R_L$, the components of the converter of this invention satisfy the following equations for matching the output impedance and ensuring the largest possible CMRR:

$$\begin{cases} R_2 = 2 \cdot R_3 = R_5 \\ R_4 = R_L - \frac{1}{g_{m2,4}} \\ R_1 = 2 \cdot R_L - \frac{1}{g_{m2,4}} - R_2 - \frac{1}{g_{m1,3}} = 2 \cdot R_L - \frac{3}{g_{m2,4}} - R_2 \end{cases} \tag{15}$$

The input differential and common mode signals are defined as follow:

$$v_d = In^+ - In^-$$

$$v_c = \frac{In^+ + In^-}{2}$$

hence, the input signals can be written as:

$$In^+ = \frac{v_d}{2} + v_c \qquad (16)$$

$$In^- = -\frac{v_d}{2} + v_c$$

The output signal of the converter can be calculated employing the small signal equivalent circuits reported in FIGS. 4*a*-4*b* and applying the superposition principle:

$$v_o = -\frac{R_L}{2} \cdot \frac{g_{m2,4}}{g_{m1,3}} \cdot \frac{1}{R_4 + R_L} \cdot In^- + \frac{R_L}{R_4 + R_L} \cdot In^+ \qquad (17)$$

Considering eqs. (2), (13) and substituting eq. (16) into eq. (17), the following equation holds:

$$v_o = \frac{2 \cdot R_L}{2 \cdot R_L - \frac{1}{g_{m2,4}}} \cdot v_d \qquad (18)$$

Generally, the impedance "seen" at the emitter terminal of transistor Q2 is much smaller than the load, that is:

$$R_L >> \frac{1}{g_{m2,4}}$$

hence:

$$v_o \cong v_d \qquad (20)$$

Figure 2:
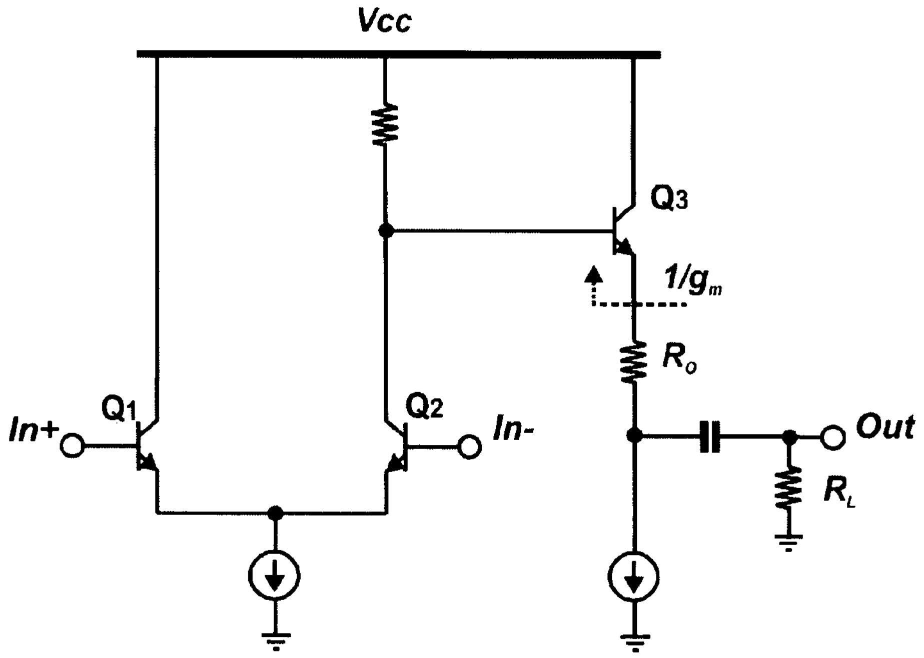
FIG. 2 shows a differential to single-ended converter with a common emitter output stage according to the prior art.

Equation (20) confirms that: common mode input signals are rejected; and differential signals are converted into single-ended signals with a unitary gain, that is without lowering the voltage level (a great improvement over the prior art architecture of FIG. 2).

Figure 5:
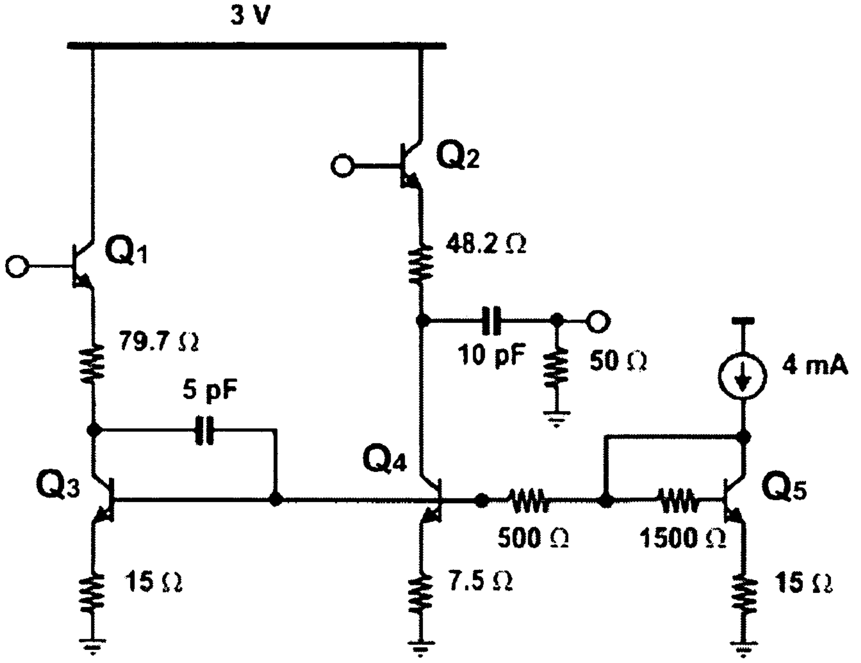
FIG. 5 shows a sample embodiment of the differential to single-ended converter of this invention.

FIG. 5 depicts a sample embodiment of the converter of this invention for a load $R_L$ of 50Ω. The functioning of the circuit of FIG. 5 has been simulated by considering it to be realized with a bipolar fabrication technology with a cut-off frequency $f_T$ of 46 GHz, and the differential signal, to be converted in a single-ended signal, was considered to be output by a differential stage having a parasitic capacitance of 100 fF on the common node of the pair of transistors composing it.

Figure 6:
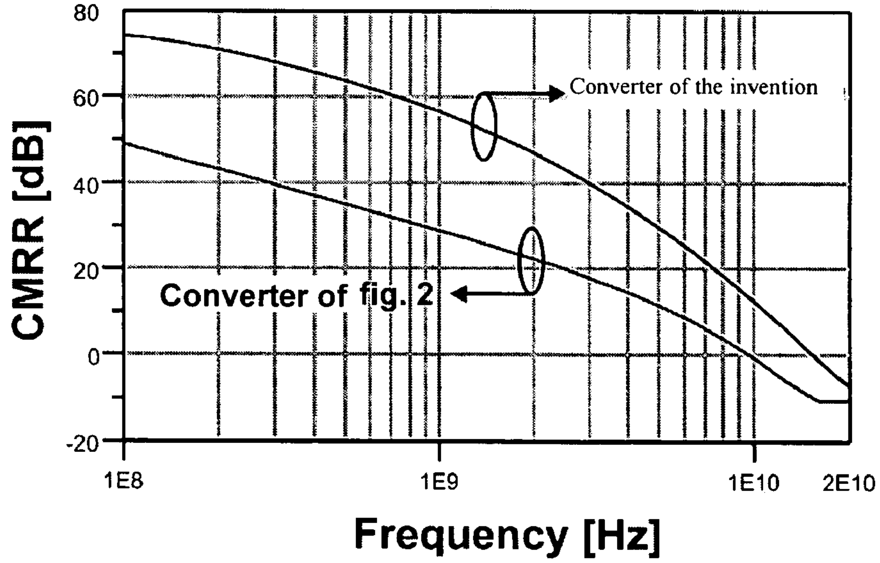
FIG. 6 is the CMRR characteristic curve of the converter of FIG. 5 for different frequencies of operation, compared with the characteristic curve of the prior art converter of FIG. 2.

FIG. 6 compares the CMRR of the converter of FIG. 5 with the CMRR of the known converter of FIG. 2 for the same parasitic capacitance of 100 fF.

Figure 7:
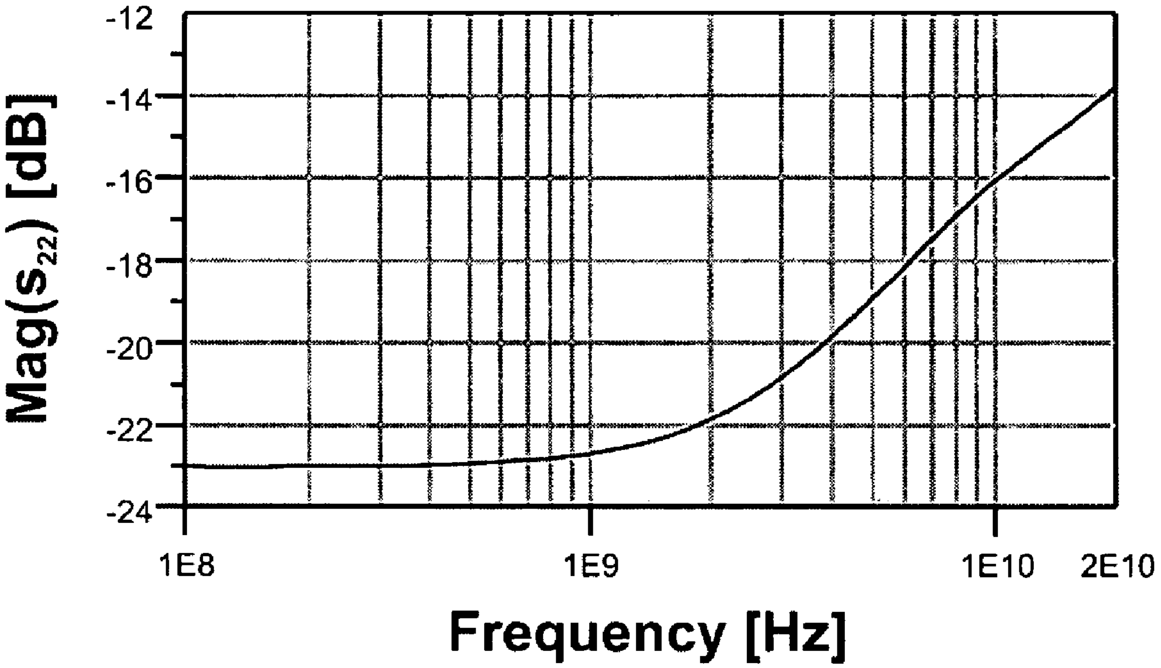
FIG. 7 is a graph of the magnitude of the output scattering parameter ($S_{22}$) of the converter of FIG. 5 for different frequencies of operation.

FIG. 7 is a graph of the magnitude of the output scattering parameter ($S_{22}$) of the converter of FIG. 5, in function of the frequency of operation. It is noted that the impedance matching is substantially independent from the frequency up to 1 GHz and maintains an acceptable value as far as up to about 20 GHz.

Figure 1:
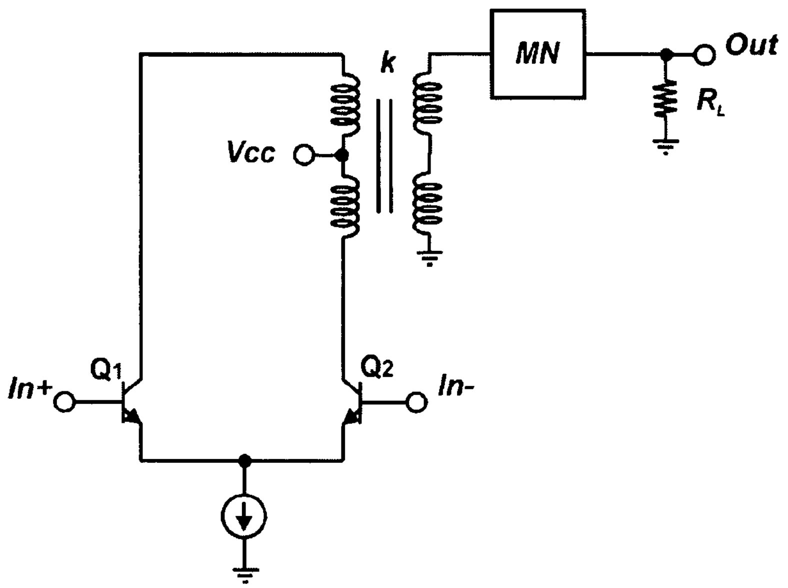
FIG. 1 shows a differential to single-ended converter with an output transformer according to the prior art.

The following table classifies the main characteristics for a comparison of the performances of the converter of this invention with those of the prior art converters of FIGS. 1 and 2. The converter of this invention appears to effectively overcome all the discussed drawbacks of the prior art converters.

TABLE 1

| | Converter of FIG. 1 | Converter of FIG. 2 | Converter of this invention |
|---|---|---|---|
| Bandwidth | narrow | wide | wide |
| CMRR | medium | small | large |
| Area consumption | large | small | small |

That which is claimed is:

1. A converter for a differential input signal into a single-ended output signal comprising:

an output node on which the single-ended output signal is generated;

a differential pair of identical first and second transistors driven by the differential input signal, said first and second transistors having first conduction terminals coupled together and second conduction terminals not coupled together;

a circuit for filtering DC components coupled between the second conduction terminal of said second transistor and said output node;

third and fourth transistors coupled in series with said first and second transistors respectively;

a fifth transistor coupled to define a current mirror with said third and fourth transistors;

a current generator biasing said fifth transistor; and respective degeneration resistors for said third, fourth and fifth transistors of said current mirror and dimensioned such that gains for each part of the differential signal are equal and of opposite sign.

2. The converter according to claim 1 wherein said first and second transistors are coupled in an emitter follower configuration.

3. The converter according to claim 1 wherein said degeneration resistors are dimensioned such that said second transistor is biased with a bias current double a bias current of said first transistor, and such that impedances from the second conduction terminals of said pair of first and second transistors are equal to each other.

4. The converter according to claim 1 wherein said circuit for filtering DC components comprises a resistor coupled in series between said second and fourth transistors for matching an output impedance to a load connected to said output node.

5. The converter according to claim 1 further comprising a degeneration resistor for said first transistor being dimensioned such that impedances from the second conduction terminals of said first and second transistor are equal to each other.

6. An integrated circuit comprising:

at least one converter for a differential input signal into a single-ended output signal and comprising an output node on which the single-ended output signal is generated, a differential pair of first and second transistors driven by the differential input signal, said first and second transistors having first conduction terminals coupled together and second conduction terminals not coupled together, a filter coupled between the second conduction terminal of said second transistor and said output node, third and fourth transistors coupled in series with said first and second transistors respectively, a fifth transistor coupled to define a current mirror with said third and fourth transistors, a current generator biasing said fifth transistor, and respective degeneration resistors for said third, fourth and fifth transistors of said current mirror and dimensioned such that gains for each branch of the differential signal are equal and of opposite sign.

7. The integrated circuit according to claim 6 wherein said first and second transistors are identical.

8. The integrated circuit according to claim 7 wherein said first and second identical transistors are coupled in an emitter follower configuration.

9. The integrated circuit according to claim 6 wherein said degeneration resistors are dimensioned such that said second transistor is biased with a bias current double a bias current of said first transistor, and such that impedances from the second conduction terminals of said pair of first and second transistors are equal to each other.

10. The integrated circuit according to claim 6 wherein said filter comprises a resistor coupled in series between said second and fourth transistors for matching an output impedance to a load connected to said output node.

11. The integrated circuit according to claim 6 further comprising a degeneration resistor for said first transistor being dimensioned such that impedances from the second conduction terminals of said first and second transistor are equal to each other.

12. A converter for a differential input signal into a single-ended output signal and comprising:

an output node on which the single-ended output signal is generated;

a differential pair of first and second transistors coupled in an emitter follower configuration and driven by the differential input signal, said first and second transistors having first conduction terminals coupled together and second conduction terminals not coupled together;

a filter coupled between the second conduction terminal of said second transistor and said output node;

third and fourth transistors coupled in series with said first and second transistors respectively;

a fifth transistor coupled to define a current mirror with said third and fourth transistors;

a current generator biasing said fifth transistor; and respective degeneration resistors for said third, fourth and fifth transistors of said current mirror and dimensioned such that gains for each branch of the differential signal are equal and of opposite sign.

13. The converter according to claim 12 wherein said first and second transistors are identical.

14. The converter according to claim 12 wherein said degeneration resistors are dimensioned such that said second transistor is biased with a bias current double a bias current of said first transistor, and such that impedances from the second conduction terminals of said pair of first and second transistors are equal to each other.

15. The converter according to claim 12 wherein said filter comprises a resistor coupled in series between said second and fourth transistors for matching an output impedance to a load connected to said output node.

16. The converter according to claim 12 further comprising a degeneration resistor for said first transistor being dimensioned such that impedances from the second conduction terminals of said first and second transistor are equal to each other.

17. A method for making a converter for a differential input signal into a single-ended output signal and comprising:

forming a differential pair of first and second transistors driven by the differential input signal, the first and second transistors having first conduction terminals coupled together and second conduction terminals not coupled together;

coupling a filter between the second conduction terminal of the second transistor and the output node;

coupling third and fourth transistors in series with the first and second transistors respectively;

coupling a fifth transistor to define a current mirror with the third and fourth transistors;

biasing the fifth transistor using a current generator; and forming respective degeneration resistors for the third, fourth and fifth transistors of the current mirror and dimensioned such that gains for each branch of the differential signal are equal and of opposite sign.

18. The method according to claim 17 wherein the first and second transistor are identical.

19. The method according to claim 18 wherein the first and second transistors are coupled in an emitter follower configuration.

20. The method according to claim 17 wherein the degeneration resistors are dimensioned such that the second transistor is biased with a bias current double a bias current of the first transistor, and such that impedances from the second conduction terminals of the pair of first and second transistors are equal to each other.

21. The method according to claim 17 wherein the filter comprises a resistor coupled in series between the second and fourth transistors for matching an output impedance to a load connected to the output node.

22. The method according to claim 17 further comprising a degeneration resistor for the first transistor being dimensioned such that impedances from the second conduction terminals of the first and second transistor are equal to each other.

* * * * *

UNITED STATES PATENT AND TRADEMARK OFFICE

CERTIFICATE OF CORRECTION

PATENT NO. : 7,288,994 B2
APPLICATION NO. : 11/337722
DATED : October 30, 2007
INVENTOR(S) : Copani et al.

It is certified that error appears in the above-identified patent and that said Letters Patent is hereby corrected as shown below:

| | |
|---|---|
| Column 2, Line 21 | Delete: “requires”<br>Insert: -- require -- |
| Column 3, Line 6 | Delete: “be”<br>Insert: -- is -- |
| Column 3, Line 22 | Delete: “RB”<br>Insert: -- $R_B$ -- |
| Column 4, Line 67 | Delete: “follow”<br>Insert: -- follows -- |
| Column 8, Line 37 | Delete: “**18**”<br>Insert: -- **17** -- |

Signed and Sealed this

First Day of September, 2009

David J. Kappos
*Director of the United States Patent and Trademark Office*